(12) United States Patent
Bergqvist et al.

(10) Patent No.: US 11,696,457 B2
(45) Date of Patent: Jul. 4, 2023

(54) SOLAR CELL LAMINATION

(71) Applicant: Epishine AB, Linköping (SE)

(72) Inventors: Jonas Bergqvist, Linghem (SE);
Thomas Österberg, Linköping (SE)

(73) Assignee: EPISHINE AB, Linköping (SE)

( * ) Notice: Subject to any disclaimer, the term of this patent is extended or adjusted under 35 U.S.C. 154(b) by 0 days.

(21) Appl. No.: 17/275,114

(22) PCT Filed: Sep. 13, 2019

(86) PCT No.: PCT/EP2019/074524
§ 371 (c)(1),
(2) Date: Mar. 10, 2021

(87) PCT Pub. No.: WO2020/053406
PCT Pub. Date: Mar. 19, 2020

(65) Prior Publication Data
US 2022/0123245 A1 Apr. 21, 2022

(30) Foreign Application Priority Data

Sep. 14, 2018 (EP) ........................................ 8194602
Feb. 18, 2019 (SE) .................................... 1950197-2

(51) Int. Cl.
*H01L 31/00* (2006.01)
*H01L 51/44* (2006.01)
(Continued)

(52) U.S. Cl.
CPC .......... *H01L 51/448* (2013.01); *H01L 27/301* (2013.01); *H01L 51/0024* (2013.01); *H01L 51/0097* (2013.01)

(58) Field of Classification Search
CPC . H01L 51/448; H01L 27/301; H01L 51/0024; H01L 51/0097; H01L 31/18; Y02E 10/549

See application file for complete search history.

(56) References Cited

U.S. PATENT DOCUMENTS 6,340,789 B1 1/2002 Petritsch et al.
6,382,367 B1 5/2002 Varzescu et al.
(Continued)

FOREIGN PATENT DOCUMENTS

EP 1902476 A2 3/2008
EP 3364474 A1 8/2018
(Continued)

OTHER PUBLICATIONS

Huang, et al., "A Semi-transparent Plastic Solar Cell Fabricated by a Lamination Process," Advanced Materials, 20:415-419 (2008).
(Continued)

*Primary Examiner* — Angelo Trivisonno
(74) *Attorney, Agent, or Firm* — Hamilton, Brook, Smith & Reynolds, P.C.

(57) ABSTRACT

The present invention relates to a solar cell sheet comprising a first and a second substrate, which first and second substrates are flexible and suitable for roll to roll printing, and the solar cell sheet further comprises one or more self-contained solar cell units, wherein each self-contained solar cell unit comprises one or more solar cell modules, and each solar cell module comprises a plurality of serially connected solar cells, wherein each of the solar cell modules comprises: a first substrate portion of the first flexible substrate and a second substrate portion of the second substrate, a plurality of first electrodes and a plurality of second electrodes arranged between the first and second substrate portions; and at least one organic active layer arranged between the plurality of first electrodes and the plurality of second electrodes; wherein, a continuous or discontinuous portion of a first adhesive material encircles each of the solar cell units. The present invention further relates to a method for producing the solar cell sheet comprising one or more self-contained solar units.

9 Claims, 5 Drawing Sheets

(51) Int. Cl.
*H01L 27/30* (2006.01)
*H01L 51/00* (2006.01)

(56) References Cited

U.S. PATENT DOCUMENTS

| | | |
|---|---|---|
| 11,532,788 B2 | 12/2022 | Österberg et al. |
| 2002/0149010 A1 | 10/2002 | Wakimoto et al. |
| 2003/0022409 A1 | 1/2003 | Epstein et al. |
| 2005/0263180 A1 | 1/2005 | Montello et al. |
| 2005/0236037 A1* | 10/2005 | Ahn .................. H01G 9/2081 136/251 |
| 2007/0125419 A1 | 6/2007 | Gui et al. |
| 2009/0152534 A1 | 6/2009 | Chabinyc et al. |
| 2010/0276071 A1 | 11/2010 | Shrotriya et al. |
| 2014/0116493 A1 | 5/2014 | Lee et al. |
| 2014/0202517 A1 | 7/2014 | Kippelen et al. |
| 2016/0196927 A1 | 7/2016 | Bryant et al. |
| 2017/0237013 A1 | 8/2017 | Park et al. |
| 2020/0006584 A1 | 1/2020 | Matsuo et al. |
| 2020/0203647 A1 | 6/2020 | Inganäs et al. |
| 2021/0305510 A1 | 9/2021 | Österberg et al. |

FOREIGN PATENT DOCUMENTS

| | | | |
|---|---|---|---|
| JP | 2006237165 A | 9/2006 | |
| JP | 2014523138 A | 9/2014 | |
| WO | 9949525 A1 | 9/1999 | |
| WO | 2007/008861 A2 | 1/2007 | |
| WO | WO-2009126115 A1 * | 10/2009 | ............. B32B 27/20 |
| WO | 2014114951 A1 | 7/2014 | |
| WO | 2018150053 A1 | 8/2018 | |
| WO | 2020038937 A1 | 2/2020 | |
| WO | 2020053406 A1 | 3/2020 | |

OTHER PUBLICATIONS

Nakamura et al., "High-performance polymer photovoltaic devices with inverted structure prepared by thermal amination," Solar Energy Materials & Solar Cells, 93:1681-1684 (2009).

International Preliminary Report on Patentability dated May 2, 2019 for International Application No. PCT/EP2018/054172 filed Feb. 20, 2018 entitled "Laminated Solar Cell Module and Method of Manufacturing Said Module."

International Search Report and Written Opinion dated May 29, 2019 for International Application No. PCT/EP2018/054172 filed Feb. 20, 2018 entitled "Laminated Solar Cell Module and Method of Manufacturing Said Module."

Notification of Transmittal of the International Search Report and the Written Opinion of the International Searching Authority, or the Declaration for PCT/EP2019/072256, titled: Laminated Module, dated Nov. 12, 2019.

Notification of Transmittal of the International Preliminary Report on Patentability for PCT/EP2019/072256, titled: Laminated Module, dated Nov. 17, 2020.

ZhenZhen et al., "Incorporating an Electrode Modification Layer with a Vertical Phase Separated Photoactive Layer for Efficient and Stable Inverted Nonfullerene Plymer Solar Cells," ACS Applied Materials & Interfaces, 9(50): 43871-43879 (2017).

Non-Final Office Action, dated Jul. 23, 2021, entitled "Laminated Solar Cell Module and Method of Manufacturing Said Module".

Kaduwal et al., "ITO-free laminated concept for flexible organic solar cells," Solar Energy Materials and Solar Cells, vol. 120, pp. 449-453, (2013).

International Search Report and the Written Opinion of the International Searching Authority for International Application No. PCT/EP2019/074524, entitled "Solar Cell Lamination" dated Dec. 11, 2019.

Written Opinion of the International Preliminary Examining Authority for International Application No. PCT/EP2019/074524, entitled "Solar Cell Lamination" dated Sep. 2, 2020.

Notice of Allowance with Applicant-Initiated Interview Summary dated Mar. 29, 2022 for U.S. Appl. No. 16/487,023, dated Apr. 5, 2022, titled "Laminated Solar Cell Module and Method of Manufacturing Said Module".

International Preliminary Report on Patentability for International Application No. PCT/EP2019/074524, titled "Solar Cell Lamination," dated Dec. 9, 2020.

Extended European Search Report for EP Application No. 18189760. 4-1230, titled: Laminated Module, dated Feb. 13, 2019.

Final Office Action for U.S. Appl. No. 16/487,023, dated Jan. 7, 2022, titled "Laminated Solar Cell Module and Method of Manufacturing Said Module".

Restriction Requirement for U.S. Appl. No. 17/268,736, dated Dec. 30, 2021, titled "Laminated Module".

Non-Final Office Action for U.S. Appl. No. 17/268,736, dated May 23, 2022, entitled "Laminated Module".

Notice of Allowance for U.S. Appl. No. 17/268,736 dated Aug. 29, 2022.

Non-Final Office Action for U.S. Appl. No. 16/487,023 dated Dec. 6, 2022.

Non-Final Office Action for U.S. Appl. No. 16/487,023, entitlted "Laminated Solar Cell Module and Method of Manufacturing Said Module," dated Mar. 2, 2023.

* cited by examiner

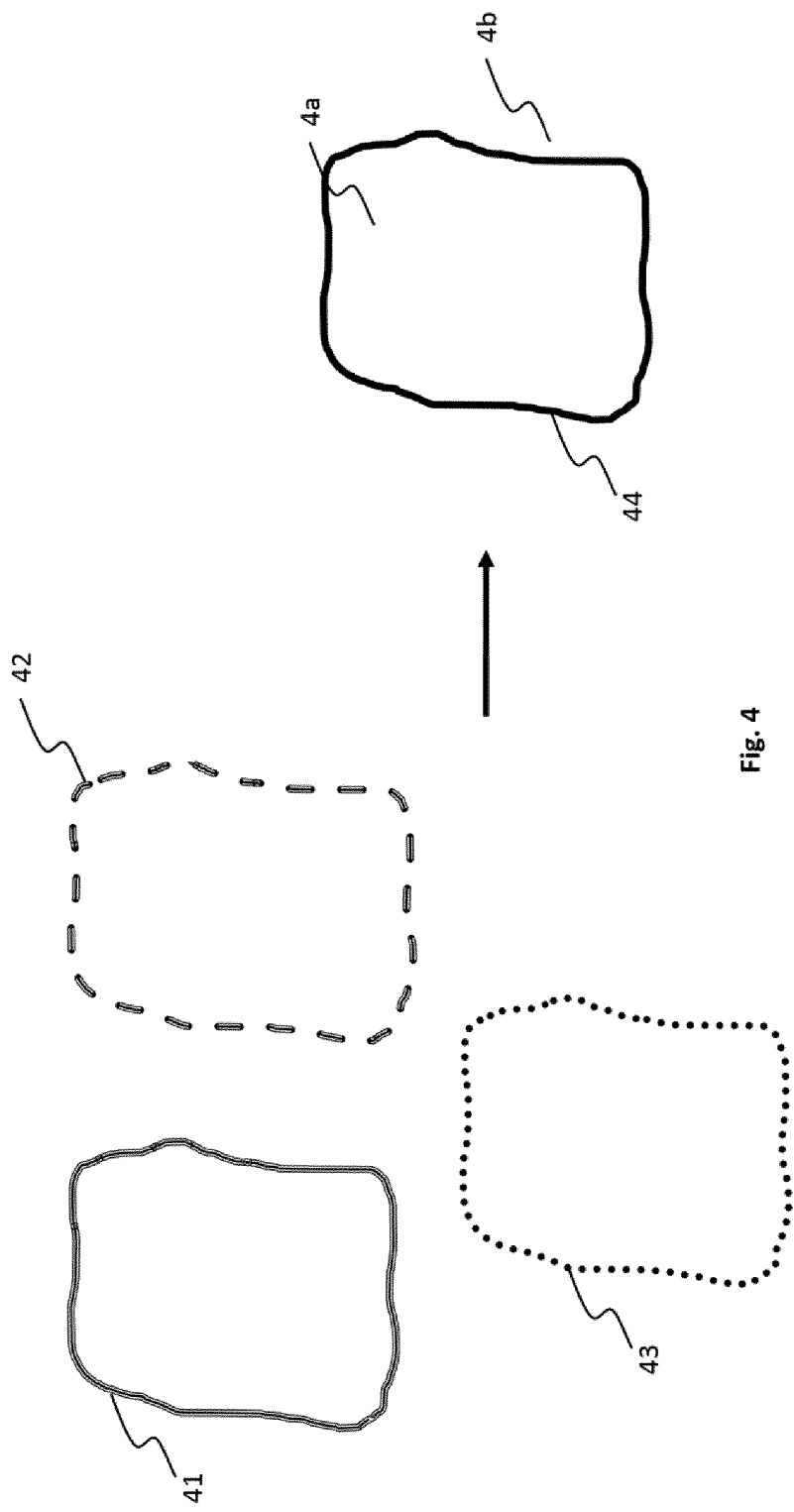

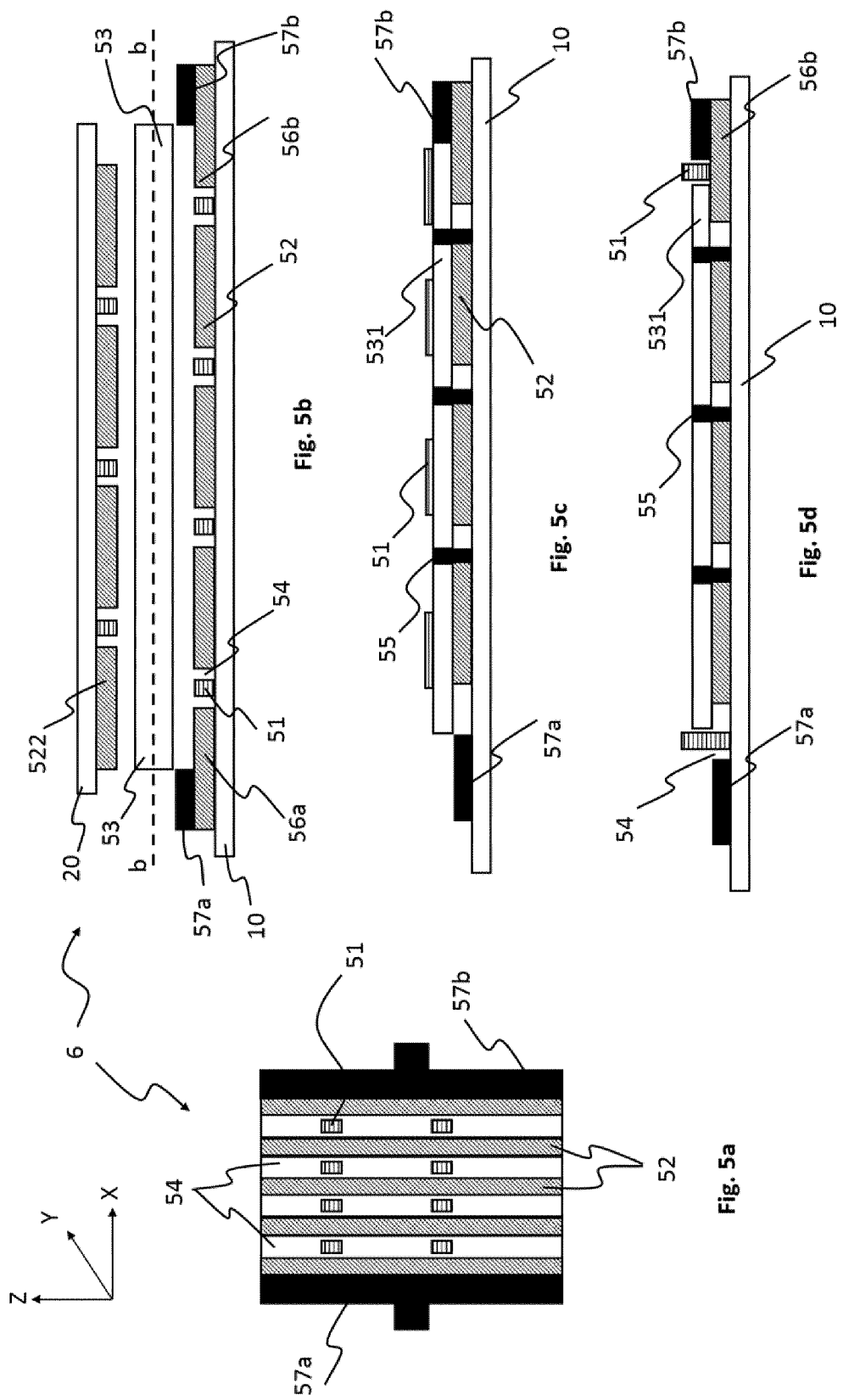

SOLAR CELL LAMINATION

This application is the U.S. National Stage of International Application No. PCT/EP2019/074524, filed Sep. 13, 2019, which designates the U.S., published in English, and claims priority under 35 U.S.C. § 119 or 365(c) to EP Application No. 18194602.1, filed Sep. 14, 2018, and SE Application No. 1950197-2, filed Feb. 18, 2019. The entire teachings of the above applications are incorporated herein by reference.

TECHNICAL FIELD OF THE INVENTION

The present invention relates to a laminated solar cell sheet and a method of producing a laminated solar cell sheet.

BACKGROUND OF THE INVENTION

To mitigate global warming, the energy generation must change from being dominated by fossil fuels in to sources with a low climate impact. Solar cells, that convert light energy directly in to electrical energy, are expected to be a major source of electricity in the future energy system. Solar cells are commonly produced from silicon oxide that is melted, purified and grown in to silicon crystals. This is a highly energy consuming process, why many thin film technologies with less energy demanding manufacturing processes have been developed. In general, a thin film solar cell comprises a photoactive semiconductor sandwiched between two electrodes. Organic solar cells are an example of thin film solar cells with a photoactive layer composed of a fine mixture of two or more organic semiconductors. A large advantage with this kind of solar cells is that they can be printed in a roll to roll process and therefore it is possible to produce large area solar cells or solar cell modules. Moreover, the material use and process energy is very low, enabling a truly low climate impact. These materials are also efficient in converting diffuse light to electricity. This allows placing organic solar cells also on vertical surfaces such as walls.

The problem of aging and degradation of the materials in the solar cell modules however is a known issue and affects the functionality of the solar cells overtime, which leads to decreased efficiency, short circuits and in worse case malfunctioning of the solar cell module. Therefore, there is a need to improve the functionality of the solar cell unit, especially over time.

SUMMARY OF THE INVENTION

It is accordingly an object of the present invention to improve the current state of the art and to mitigate at least some of the above mentioned shortcomings. These and other objects are achieved by providing a reinforced solar cell sheet and a method for producing such a reinforced solar cell sheet as defined in the appended claims.

The term exemplary is in the present context is to be understood as an example, instance or illustration.

According to a first aspect of the present invention, there is provided a solar cell sheet comprising a first and a second substrate which first and second substrates are flexible and suitable for roll to roll printing, the solar cell sheet further comprising one or more self-contained solar cell units, wherein each self-contained solar cell unit comprises one or more solar cell modules, each solar cell module comprising a plurality of serially connected solar cells, wherein each of the solar cell modules comprises:
 a first substrate portion of the first flexible substrate and a second substrate portion of the second substrate,
 a plurality of first electrodes and a plurality of second electrodes arranged between the first and second substrate portions;
 at least one organic active layer arranged between the plurality of first electrodes and the plurality of second electrodes;
wherein, a continuous or discontinuous portion of an adhesive material encircles and/or delimits each of the solar cell units.

According to a second aspect of the present invention, there is provided a method for producing a solar cell sheet, the solar cell sheet comprising one or more self-contained solar cell units, wherein each self-contained solar cell unit comprises one or more solar cell modules, the method comprising:
 providing a first and a second flexible substrate portion suitable for roll to roll deposition;
 for each solar cell module:
  providing a first set of electrodes on a predetermined portion of the first substrate,
  providing a second set of electrodes on a predetermined portion of the second substrate,
  providing a first organic active layer on one of the first and second sets of electrodes, and optionally a second organic active layer on the other of the first and second sets of electrodes,
 providing a first layer of adhesive material on the first and/or second substrate, which layer of adhesive material is continuous or discontinuous and encircles and/or delimits each one of the one or more solar cell units;
 laminating by means of heat and pressure the first and said second substrate portions together in a roll-to-roll process such that
  for each solar cell module:
   the active layer is arranged spatially between and in electrical contact with the plurality of first electrodes and the plurality of second electrodes, and
   the first layer of adhesive material adheres the first and second substrates to each other.

It is underlined that the actions listed in the second aspect may be performed in any logical order e.g. providing a first layer of adhesive material on the first and/or second substrate before providing a first or alternatively a second set of electrodes on a predetermined portion of the first or second substrates.

Effects and features of these first and second aspects of the present invention are largely analogous. Most embodiments mentioned below are compatible with both of these two aspects of the invention.

Directions and extensions of the solar cell modules is discussed below and in more details also in another patent application EP 3 364 474 A1 from the same applicant using a coordinate system. In essence, the y-direction is orthogonal or perpendicular to the first and the second substrates. The z-direction is parallel to the longest extension of the electrodes. The x-direction is orthogonal to both the y-direction and the z-direction. The x-direction may be parallel to the longest extension of the substrate portions but it may also be a direction transverse to the longest extension of the substrate portions. The longest direction of the substrate portions may be parallel to the coating direction of the roll-to-roll deposition. The longest direction of the substrate portions may be parallel to the moving direction of said substrate during the roll-to-roll deposition.

A first plurality of gaps typically separates the individual electrodes in said first plurality of electrodes from each other; and a second plurality of gaps typically separates the individual electrodes in said second plurality of electrodes from each other. In more detail, the plurality of first gaps may separate the electrodes from each other in the x-direction.

It is to be understood that each electrode in said first and second plurality of electrodes has a first and a second end portion arranged along the longest extension of said electrode.

According to one example the solar cell module has the same configuration as explained in EP 3 364 474 from the same applicant and hereby incorporated by reference, but many other configurations are possible as explained in more detail below. According to one general example the solar cell module comprises a first set of electrode stripes arranged on a first substrate and a second set of electrode stripes arranged on a second substrate, wherein the stripes in each set are from each other by gaps. In the final module the electrodes are sandwiched between the substrate, and an active layer is sandwiched between the first and second set of electrodes, wherein the solar cell module in use comprises both anode and cathode electrodes.

Detailed examples and explanations of geometries, extensions of components, suitable materials, processing, fabrication, lamination and arrangement of the solar cells and solar cell modules in the first and second aspects of the present invention are given in EP 3 364 474 A1. Such details about processing the solar cells and solar cell modules have therefore been omitted in the rest of this description for the purpose of brevity.

According to one example the solar cell sheet is arranged to improve the lifespan of the large area thin film solar cell modules and further increase mechanical stability and durability of a thin film printed large area solar cell sheet produced by means of roll to roll processing.

Although adding to the separation between the substrates and thereby increasing the probability of deficient contact between the layers, the inventors have made the realization that providing an adhesive material on the bottom and/or top substrates of the solar cell sheet normally improves the functionality of the solar cell units especially over time.

It should be understood that by a solar cell unit is meant an area on the solar cell sheet which arranged to operate as a self-contained system; moreover it is delimited and/or encircled by the adhesive material and comprises at least one solar cell module. The solar cell unit may have a bottom part arranged on the bottom substrate and a top part arranged on the top substrate of the solar cell sheet. The plurality of solar cell modules maybe arranged at the bottom and/or top parts of the solar cell unit. The solar cell unit is formed by lamination or adhesion of the bottom and top substrates. Further, it should be understood that a solar cell unit can be separated from the other solar cell units or the rest of the sheet by means of cutting or the like. For instance, the adhesive material encircling or delimiting a solar cell unit is preferably sufficiently broad so as the act of separating or cutting the solar cell unit can be performed without destroying the adhering properties of the adhesive material in action.

The smaller the thickness of the adhesive, the smaller the passage into the solar cell unit. The broader the adhesive, the better the adhesive properties. Moreover, a separation can be provided in between two neighboring lines of adhesive material which further facilitates cutting in between the adhesive lines. An advantage of cutting close to the adhesive is that it reduces the area of the unit, and thereby its environmental footprint. An advantage of cutting more remote from the adhesive is increased mechanical stability of the lamination.

It should also be appreciated that the size, thickness, area or the shape of the solar cell units may vary appropriately. For instance, the solar cell unit may have any geometrical shape such as rectangular, triangular, circular etc. or be arranged in any other arbitrary or contorted layout.

Accordingly, it has been noticed by the inventors that it is advantageous to provide an adequately thin layer of adhesive on the bottom and/or top substrates of the solar cell sheet to create a bonding between the substrates while achieving a proper contact between the top and bottom electrodes or contact points.

As non-limiting examples, the first and/or second adhesive layer may be deposited as an adhesive solvent or by transfer printing.

According to one example the thickness of the first and/or second adhesive layer exceeds the surface roughness of the substrate, or is at least 10 nm, or at least 100 nm, or at least 1 µm, or at least 10 µm, or at least 100 µm or has at least the same thickness as the stack of layers applied to the substrate. Additionally, or alternatively, the thickness of the first and/or second adhesive layer is at most 5 times, or at most 3 times or at most 2 times the thickness of the stack of layers applied to the substrate or is at most 1 mm, or at most 100 µm or at most 10 µm. The above measures refer to the thickness of the adhesive layer after it has been applied but before the lamination of the two substrates.

In accordance with at least one exemplary embodiment of the present invention, the thickness of the substrate portion and/or the second substrate portion is at least 10 µm or at least 50 µm or at least 100 µm; additionally or alternatively the thickness of the substrate portion and/or the second substrate portion is at most 50 µm or at most 100 µm or at most 200 µm.

In accordance with an exemplary embodiment of the present invention, the width of the adhesive material after the lamination or adhesion step may be at least 10 µm, or at least 100 µm or at least 1 mm and/or at most 5 mm or at most 1 mm or at most 0.1 µm.

The thicker layer may create a separation between the bottom and top electrodes or contact points which may lead to breakage of the electric circuit partly or throughout the solar cell sheet.

In accordance with an exemplary embodiment of the present invention, the thickness of the adhesive material after the lamination or adhesion step may be at least 10 nm or 50 nm or 100 nm or 0.5 µm or 1 µm or 10 µm or 100 µm or 1 mm. Optionally or alternatively, the thickness of the adhesive material after the lamination or adhesion step may be at most 50 nm or at most 100 nm or at most 0.5 µm or at most 1 µm or 10 µm or at most 100 µm or at most 1 mm. According to one embodiment, these measures refer to the thickness of the adhesive layer after the lamination and after a drying of the adhesive. According to one example, the thickness of said first adhesive material is determined after said lamination, and after evaporation of solvent from said adhesive.

Drying of the adhesive is to be understood as the adhesive composition undergoing evaporation of solvent. Drying therefore entails that the amount of dry substance in the adhesive increases.

"After evaporation of solvent from said adhesive" is to be understood as the point in time when the drying process is completed, i.e. when the temperature of the solar cell sheet is between 15-40° C. after a heated drying step or at least when the manufacturing of the solar cell sheet has been completed. Normally, there is an initial more rapid decrease of solvent followed by a more steady state. The thickness of the adhesive layer after evaporation of solvents is preferably determined at this more steady state.

Drying may be achieved in a separate step which includes heating of the solar cell sheet. Drying may also be achieved after lamination in room temperature.

It is to be understood that what has been stated herein with respect to the first adhesive material also applies to the second adhesive material, e.g. regarding thicknesses and application procedures.

In accordance with yet another exemplary embodiment of the present invention the adhesive material after lamination or adhesion step may undergo a change in its thickness dependent on the compressibility of the adhesive. Another factor that may influence the dimensions of the adhesive in the laminated product is e.g. vapour pressure and the wetting of the adhesive on the substrate and effects related thereto.

It is to be noted that the thickness of the plurality of first electrodes and the plurality of second electrodes maybe at least 20 nm or 50 nm, and/or at most 300 nm or 2000 nm. Further, the combined thickness of the active layer may be at least 30 nm or 80 nm and/or at most 350 nm or 1000 nm.

The thicker adhesive layers provide a better adhesion and the thinner adhesive layers prevent overflowing of the adhesive material when performing the act of lamination or adhesion of the solar cell sheet substrates. Further, the more working area and no hindrance of electrical contact is provided with sufficiently thin adhesive layers.

In accordance with one exemplary embodiment of the present invention the adhesive material before lamination or adhesion step may have a width of at least 0.5 mm and/or at most 1mm or at most 5 mm. The adhesive layer may undergo a change in the width and thickness at the adhesion or lamination step.

According to one embodiment the first and/or the second adhesive materials partly or fully consists of a hydrophobic adhesive material. This has the advantage of protecting the inner part of the solar cell units from the outside moisture or keeps the inner part of the solar cell units at a slightly elevated or lower humidity compared to the ambient humidity. This adjusted working humidity of the inner part of the solar cell units may be advantageous for manufacturing solar cell sheets for use in different climate conditions and thermal cycles.

According to one embodiment the first and/or the second adhesive materials partly or fully consists of an adhesive material with low oxygen permeability.

Additionally, the adhesive material may serve as an isolation layer between the inner part of the solar cell units and the outer part of the solar cell units which may be immediately exposed to outside environment. Thus the adhesive material may protect the solar cell units from penetration of undesired moisture, oxygen, dust particles or any type of aerosol particulates which may hinder the functionality of the solar cell units.

According to one example the first and/or second adhesive comprises a first line or stripe encircling and/or delimiting the solar cell unit. In addition to this first line/stripe the adhesive also comprises a second line or stripe encircling and/or delimiting the solar cell unit, which second line/stripe is preferably arranged close to said first line/stripe. According to one embodiment each one of the lines/stripes only partly encircles the solar cell unit, while together they fully encircle the solar cell unit. According to another embodiment one or both of the lines fully encircles the solar cell unit. The first and the second lines/stripes may be of the same or different adhesive materials. One of the lines/stripes may e.g. consist of a hydrophobic adhesive material designed to decrease the passage of moister there through; and the other of the lines may e.g. consist of an adhesive material with low oxygen permeability designed to decrease the passage of oxygen there through. A line may also comprise interleaved or alternating portions of hydrophobic adhesive material and adhesive material with low oxygen permeability along the extension of the line.

According to yet another embodiment of the present invention the first adhesive material maybe conductive or non-conductive. This has the advantage of the adhesive material acting as an insulator in certain directions to prevent short circuits from happening.

In accordance with an exemplary embodiment of the present invention, the solar cell sheet may be further provided with a plurality of discontinuous portions of a non-conductive adhesive material spatially arranged within each solar cell module.

The solar cell comprises a first set of electrodes arranged on a first substrate and a second set of electrodes arranged on a second substrate. The outer most edge of the outer most electrodes define the outer edge of the inner area of the solar cell module in a direction substantially along the extension of the electrodes; and the extension the electrodes in the y-direction defines the outer edge of the inner area in a direction substantially transverse to the extension of the electrodes.

By, the term within the solar cell module, it should be understood the space inside the inner area a solar cell module e.g. on said first and/or second substrate, or inside the inner area and between said first and second substrates.

By further providing each and/or a number of solar cell modules with additional discontinuous portions of a second adhesive material which is non-conductive spatially arranged within the respective solar cell module, the lifetime and mechanical durability of the solar cell sheet further increases. This is particularly interesting for creating large areas of flexible solar cell sheets wherein breakage of the top and bottom substrates of the solar cell sheet may occur more frequently due to mechanical strain or ambient temperature and humidity conditions.

In another exemplary embodiment of the present invention, the adhesive material may be colored with any colour e.g. black, red, white or green so as to create an ornament or an easily observable delimitation on the first or the second substrate with aesthetic appearances.

Materials

The plurality of first and second electrodes comprises an electrode material which electrode material may be a conducting organic compound, a metal, a metal oxide or combinations thereof. The conducting organic compound may for example be a conducting organic small molecule or a conducting polymer. The conducting polymer may for example be poly(3,4-ethylenedioxythiophene) polystyrene sulfonate (PEDOT:PSS) or variants thereof, e.g. PEDOT: PSS PH1000. The metal may be chosen from a list comprising but not limited to: aluminium (Al), chromium (Cr), titanium (Ti), cupper (Cu), gold (Au) and silver (Ag). The metal oxide may be for example indium tin oxide (ITO) and aluminium zinc oxide (AZO). According to at least one example embodiment of the present invention, the electrode may comprise one or more layers. For example, the electrode may be an ITO/metal/ITO (IMI) electrode comprising a first layer of ITO, a second layer of a metal and a third layer of ITO. The electrode may for example comprise ITO/Ag/ITO.

It shall be understood that the plurality of first and the second electrodes may extend in any direction over the substrate portions and they may have any extension, e.g. straight and/or curved. They may also be parallel or non-parallel. Moreover, it shall be understood that they may have substantially same width of the entire length or they may have a varying width of the entire length. All of the plurality of first and second electrodes may have the same width or different electrodes may have different widths.

The plurality of first and second electrodes may be provided by a variety of deposition techniques, for example they may be provided by means of thermal evaporation, sputtering, spray-coating, printing or coating e.g. slot-die coating. According to at least one embodiment of the present invention the plurality of first electrodes and the plurality of second electrodes may be provided by the same deposition technique. According to at least another example embodiment of the invention the plurality of first and second electrodes may be provided by different techniques.

The first and the second contacting electrode may comprise a first layer of an electrode material provided by e.g. evaporated, spray-coated, or printed, and a busbar connected thereto. The busbar may for example be made from graphite or silver and may be screen printed. Optionally Instead of, or in addition to, the busbar, the connecting electrode may comprise further printed or laminated layers. The contacting electrodes may be divided in two parts, where the first part may be used as one of the electrodes in one solar cell comprised in the solar cell module and where the other part is used for connecting the solar cell module to a unit for collecting electricity when the solar cell module is in use. The part of the contacting electrode used for connecting the solar cell module is normally not covered by active layer.

Adhesive Material

The first and/or second adhesive material may comprise Thermoplastic polymers, e.g.: Thermoplastic polyurethane, Polypropylene, Polybutylene, Polyvinyl butyral, Ethyl vinyl acetate, Polystyrene butadiene copolymers or Ethylene vinyl alcohol copolymers and combinations thereof.

Addtionally or alternatively, the first and/or second adhesive material may comprise UV curing polymers; such as Acrylic and/or epoxy based UV curing polymers.

Contacting Electrode Material

The contacting electrodes comprises an electrode material which may comprise a conducting organic compound, a conducting carbon compound, a metal, a metal oxide or combinations thereof. The conducting organic compound may for example be a conducting organic small molecule or a conducting polymer. The conducting polymer may for example be poly(3,4-ethylenedioxythiophene) polystyrene sulfonate (PEDOT:PSS) or variants thereof, e.g. PEDOT:PSS PH1000. The conducting carbon compound may be provided as a carbon paste or as graphite or graphene. The metal may be chosen from a list comprising but not limited to: aluminium (Al), chromium (Cr), titanium (Ti), cupper (Cu), gold (Au) and silver (Ag). The metal oxide may be chosen from a list comprising but not limited to: indium tin oxide (ITO) and aluminium zinc oxide (AZO). According to at least one example embodiment of the invention the metal is provided as an ink where the metal is provided as nanoparticles, e.g. nano-spheres or nano-rods. According to at least one example embodiment of the present invention, the electrode may comprise one or more layers. For example, the electrode may be an ITO/metal/ITO (IMI) electrode comprising a first layer of ITO, a second layer of metal and a third layer of ITO. The electrode may for example comprise ITO/Ag/ITO. The electrode material may be the same electrode material as for the plurality of the first or second electrodes or it may be a different electrode material.

Active Layer Material

The continuous or discontinuous active layer or the first and the second continuous or discontinuous active layer may comprise a compound which absorbs wavelengths within the range of 350-950 nm, it may for example absorb light within the visual spectrum, i.e. wavelengths within a range from 400 nm to 700 nm. Moreover, said compound shall be able to provide charges due to that absorption of light.

It shall be understood that a continuous active layer is an active layer that covers both the plurality gaps between electrodes and the plurality of first or second electrodes in both the x-direction and the z-direction such that the photo active area, i.e. the area where light is absorbed, of the solar cell module is increased. Moreover, it shall be understood that the first continuous active layer covers both the plurality of first electrodes and the plurality of gaps between those electrodes. In the same manner, the second continuous active layer covers both the plurality of second electrodes and the plurality of gaps in between those. In other words, it shall be understood that the continuous active layer or the first and the second continuous active layer are provided globally over the plurality of first and second electrodes and gaps between each of the plurality of first and second electrodes. According to at least one example embodiment the continuous active layer or the first and/or the second continuous active layer may be an organic active layer and may comprise a donor material and/or an acceptor material. According to at least one example embodiment, all the active layers in the solar cell sheet are organic active layer. The donor material may be a semi-conducting polymer or a semi-conducting small organic molecule. The semi-conducting polymer may for example be any semi-conducting polymer and their derivatives, including but not limited to:, polythiophenes, polyanilines, polypyrroles, polycarbazoles, polyvinylcarbazoles, polyphenylenes, polyphenylvinylenes, polysilanes, polythienylenevinylenes, polyisothianaphthanenes, polycyclopentadithiophenes, polysilacyclopentadithiophenes, polycyclopentadithiazoles, polythiazolothiazoles, polythiazoles, polybenzothiadiazoles, poly(thiophene oxide)s, poly(cyclopentadithiophene oxide)s, polythiadiazoloquinoxaline, polybenzoisothiazole, polybenzothiazole, polythienothiophene, poly(thienothiophene oxide), polydithienothiophene, poly(dithienothiophene oxide)s, polytetrahydroisoindoles, and copolymers thereof. The semi-conducting polymer may also be an iso-indigo-based polymer. In more detail, the semi-conducting polymer may for example be: P3HT, PTB7, TQ1, P3TI, PCDTBT, or PffBT4T-2OD. The semi-conducting small molecule may for example be a molecule comprising at least one benzodithiophene group, e.g. DRTB-T or BDT3TR. The acceptor material may for example be a semi-conducting polymer or a semi-conducting small molecule. The semi-conducting polymer may for example be N2200 or PNDI-T10. The semi-conducting small organic molecule may for example be a fullerene, a fullerene derivative or any other semi-conducting small molecule such as (5Z,5'Z)-5,5'-{(9,9-dioctyl-9H-fluorene-2,7-diyl)bis[2,1,3-benzothiadiazole-7,4-diyl(Z)methylylidene]}bis(3-ethyl-2-thioxo-1,3-thiazolidin-4-one) (FBR), or 3,9-bis(2-methylene-(3-(1,1-dicyanomethylene)-indanone)-5,5,11,11-tetrakis(4-hexylphenyl)-dithieno[2,3-d:2',3'-d']-s-indaceno[1,2-b:5,6- b']dithiophene) (ITIC). The fullerene derivative may be the phenyl-C61-butyric acid methyl ester (PC61BM), the phenyl-C71-butyric acid methyl ester (PC71BM), the indene-C60-bisadduct (ICBA), O-IDTBR or IC-C6IDT-IC.

According to at least one example embodiment of the invention, the mixture of a donor and an acceptor material may be provided as a bulk-heterojunction.

Additionally, the electrodes, the contacting electrodes, the active layer maybe provided with further materials and further deposition techniques than mentioned above, the details of which can be found in document EP 3 364 474 A1 incorporated herein by reference.

In accordance with another exemplary embodiment of the present invention, each of the at least one solar cell modules is encircled/delimited by a continuous or discontinues portion of said first adhesive material.

In accordance with yet another exemplary embodiment of the present invention, the first adhesive layer maybe discontinuous and the ratio between covered and uncovered area along one direction of the extension of the second adhesive layer and within a solar cell module may be at least 1% or at least 10% or at least 20% and/or at most 40% or at most 30% or at most 25%.

In accordance with yet another exemplary embodiment of the present invention, the second adhesive material maybe optically transparent within a wavelength range of the at least one organic active layer.

In accordance with yet another exemplary embodiment of the present invention, the method of producing the solar cell sheet may further comprise providing each one of the at least one solar cell modules with a plurality of discontinuous portions of a second adhesive non-conductive material spatially arranged within the solar cell module.

In accordance with yet another exemplary embodiment of the present invention the method of producing the solar cell sheet may further comprise laminating by means of heat and pressure the first and the second substrate portions together in a roll-to-roll process such that for each solar cell module the plurality of discontinuous portions of the second adhesive non-conductive material adheres two opposite portions of the solar cell module to each other.

In accordance with yet another exemplary embodiment of the present invention the first and second adhesive materials maybe UV-adhesive/UV-curable adhesive materials.

These and other features of the present invention will in the following be further clarified with reference to the embodiments described hereinafter.

BRIEF DESCRIPTION OF THE DRAWINGS

The above objects, as well as additional objects, features and advantages of the present invention, will be more fully appreciated by reference to the following illustrative and non-limiting detailed description of embodiments of the present invention, when taken in conjunction with the accompanying drawings, wherein:

FIG. 4 shows a schematic and top cross-sectional view of various adhesive material layouts in accordance with at least one embodiment of the present invention;

FIGS. 5a-5d show a schematic and top and side cross-sectional views of a plurality of solar cells in accordance with at least one embodiment of the present invention;

DETAILED DESCRIPTION OF THE DRAWINGS

Figure 1A:
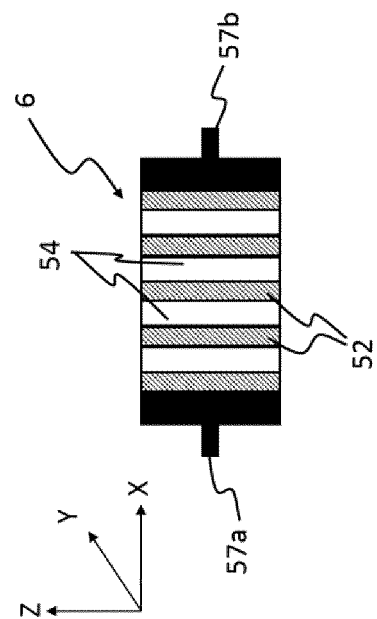
FIG. 1a shows a schematic and cross-sectional top view of a solar cell sheet with solar cell units in accordance with at least one embodiment of the present invention.

In the present detailed description, embodiments of the present invention will be discussed with the accompanying figures. It should be noted that this by no means limits the scope of the invention, which is also applicable in other circumstances for instance with other types or variants of methods for laminating a solar cell module or other types or variants of solar cell module than the embodiments shown in the appended drawings. Further, that specific features are mentioned in connection to an embodiment of the invention does not mean that those components cannot be used to an advantage together with other embodiments of the invention.

The following description will use terms such as "top", "bottom", "outer" etc. These terms generally refer to the views and orientations as shown in the drawings. The terms are used for the reader's convenience only and shall not be limiting.

FIG. 1a schematically shows a solar cell module 6, comprising a first set of electrode stripes 52 arranged on a first substrate and a second set of electrode stripes arranged on a second substrate, wherein the stripes in each set are separated from each other by gaps 54. Moreover, the electrodes are sandwiched between the first and second substrates, and an active layer is sandwiched between the first and second set of electrodes. Additionally, the solar cell module comprises a first and a second electrode or busbar 57a, 57b for extracting the generated energy.

Figure 1B:
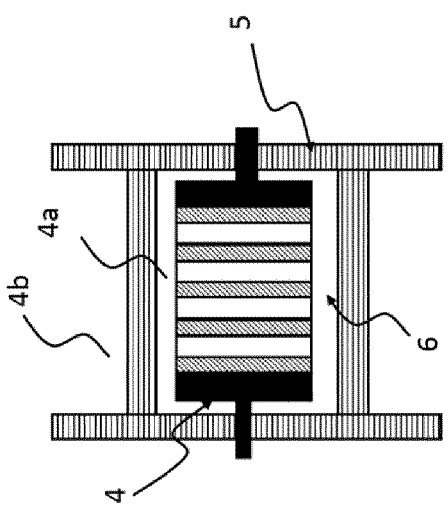
FIGS. 1b-1f show a schematic and top cross-sectional view of one of the solar cell units in FIG. 1a in accordance with at least one embodiment of the present invention.

FIG. 1b illustrates one example of a solar cell module encircled and delimited by adhesive material adhesive material 5, which may be a conductive adhesive or a non-conductive adhesive material that encircles/delimits the area of the solar cell unit 4. The adhesive material 5 divides the substrate in an inner part 4a and an outer part 4b. The inner part 4a comprises at least one solar cell module 6 as shown in FIG. 1b.

In FIG. 5b-5d, the solar cell module 6 comprises a first flexible substrate portion 10 on which a plurality of first electrodes 52 is arranged as well as a first continuous or discontinuous active layer 53. The first substrate portion 10 may be transparent or semi-transparent. The first substrate portion 10 as well as the first plurality of electrodes 52 are suitable for roll-to-roll processing methods, e.g. roll-to-roll printing, roll-to-roll coating and roll-to-roll lamination.

The plurality of first electrodes 52 are provided as substantially parallel stripes on the first substrate portion 10. The plurality of first electrodes 52 extends along the substrate in the z-direction. In other words, the longest extension of the stripes will here be in the z-direction. As shown in FIG. 5a, the longest extension of the first substrate portion 10 and the plurality of first electrodes 52 is here the same direction. The plurality of first electrodes 52 is arranged such that they are spatially separated from each other in a x-direction, which separation forms a plurality of gaps 54 between said first electrodes 52. In an alternative embodiment, the longest extension of the stripes may be in a direction transverse or orthogonal to the longest extension of the substrate. In more detail, when the longest extension of the substrate is in the z direction, the longest direction of the plurality of first electrodes 52 may be in the x-direction or in any direction between x and z.

The solar cell module 6 may further comprise a second flexible substrate portion 20 having the same configuration as described in relation to the first substrate unless otherwise is stated. In other words, there may be a plurality of second electrodes 522 and a second continuous or discontinuous active layer 53.

The solar cell module 6 may further comprise a first and second contacting electrode 56a, 56b optionally comprising a respective first and a second busbar 57a, 57b or contacting points.

It shall be noted that the thickness of the different layers, e.g. the first and the second active layer 53, or the plurality of first 52 or second 52 electrodes have not been drawn to scale.

Alternatively, the solar cell modules 6 may be arranged as described in EP 3 364 474 A1.

Figure 1C:
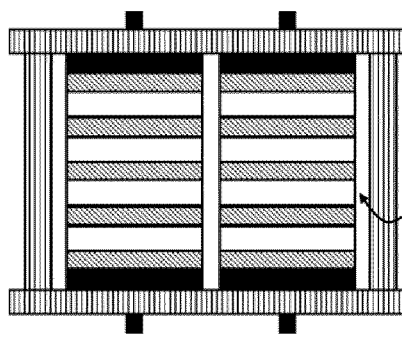

In a different example as shown in FIG. 1c, a solar cell unit 4 may comprise more than one solar cell modules 6.

Figure 1D:
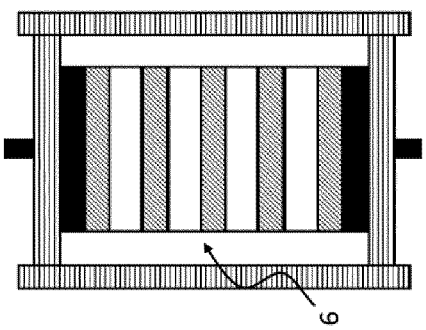
Figure 1E:
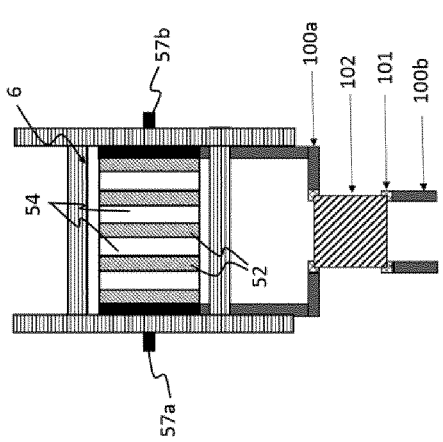
Figure 1F:
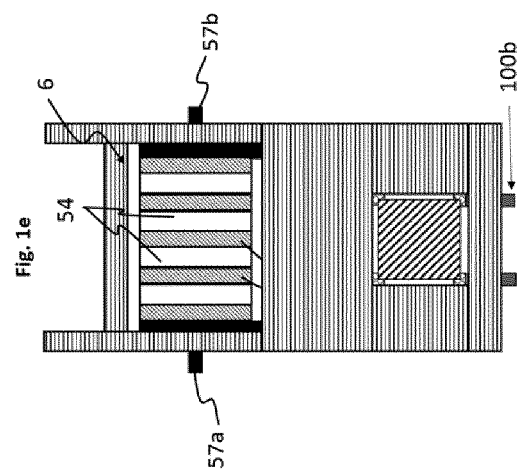

According to another example, shown in FIG. 1d and FIG. 1e, the solar cell unit further comprises another type of component 102 such as a logic circuit or a flat PCB. The component is optionally attached at contact points 101, and connected to the solar cells by means of electronic conductors 100a, and may also comprise further electrodes 100b for connection to other devices. In FIG. 1d the solar cell unit is shown without adhesive applied on top, and in FIG. 1e the solar cell unit is shown before lamination to the second substrate when the adhesive has been applied (where preferably at least the part covering the electronic conductors is non-conductive).

Figure 2:
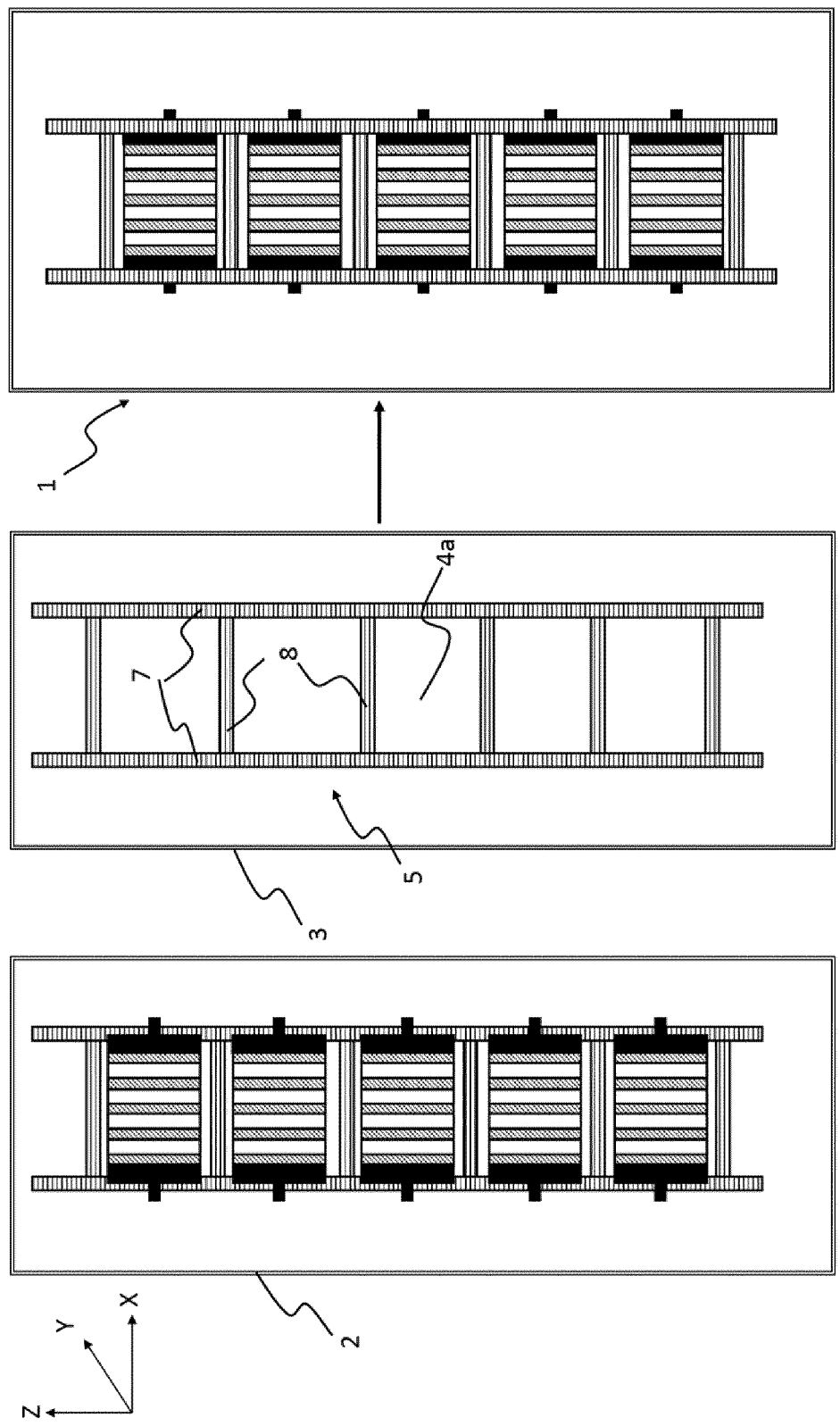
FIG. 2 shows a schematic and top cross-sectional view of top and bottom parts of the solar cell units in FIG. 1a in accordance with at least one embodiment of the present invention.

FIG. 2 shows one example of forming the solar cell units 4 on the solar cell sheet 1, wherein the solar cell modules 6 are arranged on the bottom substrate 2 and the top substrate 3 is provided with the adhesive material 5.

In the arrangement in the example, the adhesive material 5 is applied on the bottom substrate 2 in stripes 7 continuously extending in the z direction and further with intersecting continuous portions 8 extending in the x direction. In more detail, the intersection where the extensions of the adhesive material extending in x and z directions meet, creates the delimited inner area 4a of the solar cell units in a ladder-like appearance. By laminating the top and bottom substrates 2,3 together while aligning the adhesive portions 5 on the respective substrates, the completed solar cell sheet is created.

According to one embodiment the adhesive material is printed close to (within 10 nm to 1 mm from the solar cell) or even on top of the solar cell module, as a minimization of gaps at the inner surface may facilitate the reduction of air pocket in the finished product.

Figure 3D:
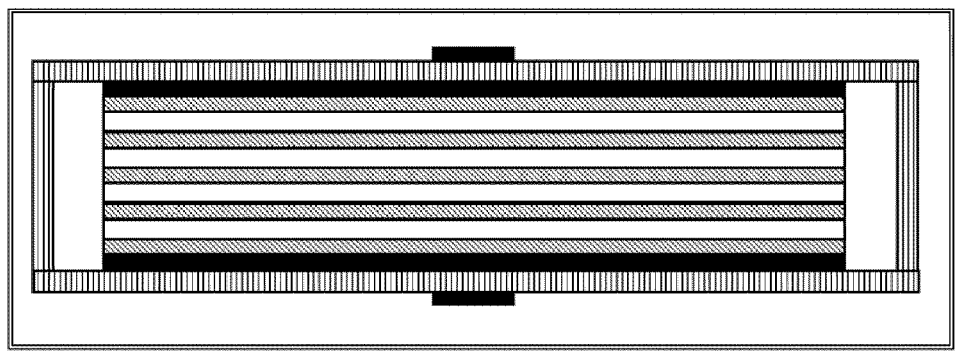
FIGS. 3a-3d show a schematic and top cross-sectional view of a plurality of solar cell units in accordance with at least one embodiment of the present invention.
Figure 3C:
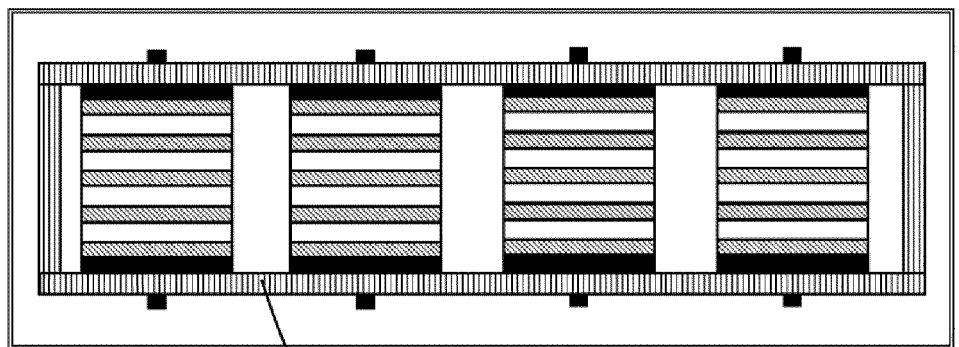
Figure 3B:
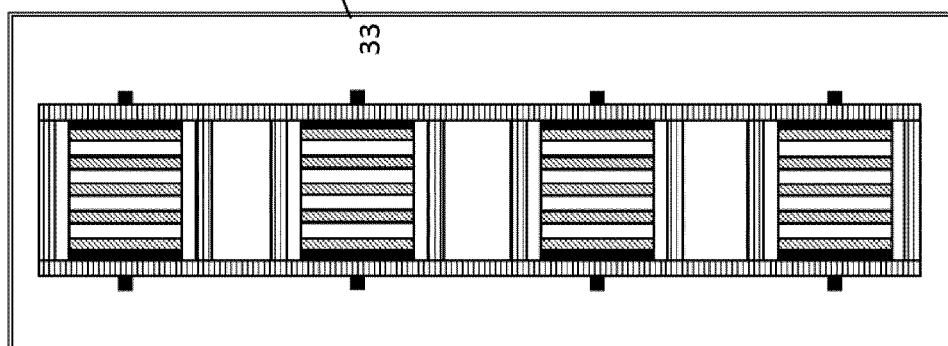
Figure 3A:
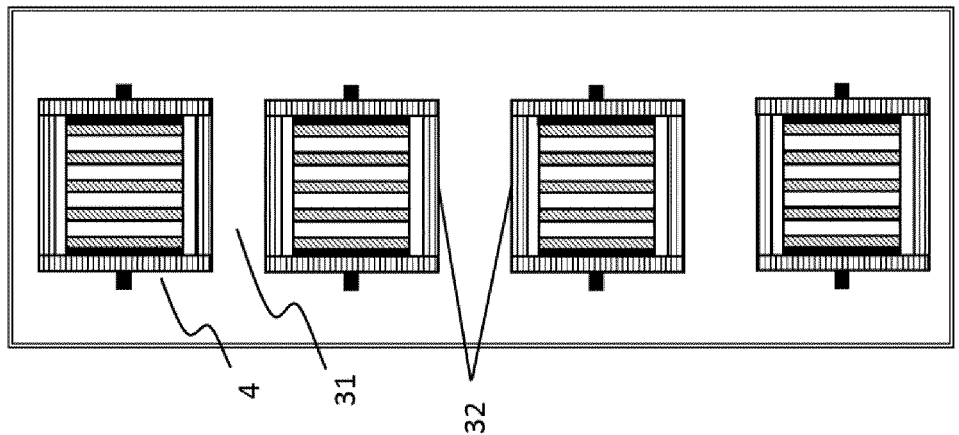

According to another embodiment each solar cell unit 4 may be delimited individually by the adhesive material as shown in FIG. 3a. In this embodiment each solar cell unit 4 is defined by an adhesive border line 32 encircling a respective one of the solar cell units, which border lines create gaps 31 between two adjacent solar cell units 4 and may facilitate cutting the solar cell units 4 apart while maintaining the adhesive properties of the adhesive. Additionally, it may reduce the amount of adhesive material required for adhering the solar cell substrates 1. Further, as shown in FIG. 3b and FIG. 3c, the solar cell sheet 1 may comprise a single solar cell unit 33 e.g. extending fully or substantially throughout the whole area of the solar cell sheet 1. The single solar cell unit 33 may comprise a plurality of solar cell modules 6, as shown in FIG. 3b or may comprise a single solar cell module 6 extending throughout the entire unit as shown in FIG. 3c. The solar cell modules 6 within each solar cell unit 4, 33 may be connected to the contacting electrodes or busbar contacting points individually, or be electrically connected in series or in parallel to form an expanded network of solar cell modules.

To produce the solar cell sheets 1, the adhesive layer may be applied on both the bottom substrate 2 and the top substrate 3 or on only one of the substrates. The adhesive material 5 may be provided in any geometrical shape or contour, where a circular, triangular, or rectangular shape are basic examples. As shown in FIG. 4, the adhesive material 5 may be applied in a continuous manner e.g. in a continuous line 41, in a broken line 42 or in any other layout 43 which will be desired for the fabrication process. The adhesive layers maybe applied on the substrates as individual portions 43 arranged with a determined separation gap in respect to each other as seen in FIG. 4. It is advantageous however, that after the adhesion or lamination step of the bottom 2 and top 3 substrates, the adhesive material 5 applied in any of the above-mentioned manners forms a continuous boundary 44 delimiting the solar cell units 4. The delimiting boundary 44 serves as a barrier between the inner part 4a and outer part 4b of the solar cell modules 4, and may serve to maintain the isolation between the solar cell units and the outside environment. For example, the humidity conditions inside the units may be configured to be kept at a certain level in respect to the ambient humidity. In addition, the barrier protects the units from outside pollutants such as dust particles or atmospheric particulate matters such as smog, soot, etc. which may enter and destroy the solar cell modules 6. In other words, the adhesive layer in addition to improving the mechanical stability of the solar cell sheets 1 acts as a protective barrier which shields the solar cell units 4 from the outside environment.

According to one example the boundary 44 comprises a first line encircling and/or delimiting the solar cell unit. In addition to this first line the boundary also comprises a second line encircling and/or delimiting the solar cell unit, which second line is preferably arranged close to said first line. According to one embodiment each one of the lines only partly encircles the solar cell unit, but together they fully encircle the solar cell unit. According to another embodiment one or both of the lines fully encircles the solar cell unit. The first and the second lines may be of the same or different adhesive materials. One of the lines may e.g. consist of a hydrophobic adhesive material designed to decrease the passage of moister there through; and the other of the lines may e.g. consist of an adhesive material with low oxygen permeability designed to decrease the passage of oxygen there through. A line may also comprise interleaved or alternating portions of hydrophobic adhesive material and adhesive material with low oxygen permeability along the extension of the line.

This second line may partly or fully encircle the solar cell unit, whereas the first line fully encircles the solar cell unit.

In another exemplary embodiment as shown in the top cross-sectional view of a solar cell module in FIG. 5a, the solar cell modules 6 may include individual portions 51 of the adhesive material arranged within each solar cell module. Such portions maybe arranged in various spatial distribution on the substrate portions 10, 20. For example, in FIG. 5b, a cross-sectional side view of the same solar cell module 6 of FIG. 5a with five solar cells on the bottom substrate portion is depicted. In this embodiment, the portions 51 of adhesive material are placed within the gaps 54 created between adjacent electrodes 52, 522. The discontinuous adhesive material in this example is a non-conductive material. As mentioned earlier, the solar cell modules 6 may or may not optionally include a continuous or discontinuous active layer 53 on the second substrate portion. In this example the active layer 53 is only provided on the first substrate portion 10.

In another example embodiment shown in FIG. 5*c-d,* the active layer 53 maybe discontinuous and the first and second electrodes may be connected via electric conductors 55 placed within the gaps 54 of adjacent electrodes on the first 10 and the second 20 substrate portions. In this case the adhesive material may be placed on the first 531 and/or a second active layer (not shown) of the first 10 and the second 20 substrate portions. Optionally, the adhesive material is transparent within the working wavelength of the solar cells so as not to affect the functionality of the module.

In yet another example shown in FIG. 5*d,* in the same solar cell module 6 of FIG. 5*c,* the discontinuous portions 51 of the adhesive material may be placed within the gaps 54 between the contacting electrodes 56*a,* 66*b,* the gaps 54 between the first active layer and busbar contacting points 57*a,* 57*b* or the gaps 54 between the contacting electrodes 56*a,* 66*b* and busbar contacting points 57*a,* 57*b*.

The skilled person realizes that a number of modifications of the embodiments described herein are possible without departing from the scope of the invention, which is defined in the appended claims. For instance, the stripes of the plurality of the adhesive materials used may be applied on the substrates in any other positions as well as geometrical shape and arrangements than explained in the examples above. Further, other components of the solar cell units such as first and second electrodes may for example be of any other curvature than the one shown in the figures. They may also be deposited such that their longest extension being in any direction between the x- and z-directions. Hence, they need not be neither parallel nor perpendicular to the longest extension of the substrate. The skilled person also realizes that other conducting or semiconducting materials can be used as either electrodes or in the active layers of the solar cell module.

The invention claimed is:

1. A solar cell sheet comprising a first and a second substrate which first and second substrates are flexible and rollable, said solar cell sheet further comprising one or more self-contained solar cell units, wherein each self-contained solar cell unit comprises one or more solar cell modules, each solar cell module comprising a plurality of serially connected solar cells, wherein each of said solar cell modules comprises:
   a first substrate portion of said first flexible substrate and a second substrate portion of said second substrate,
   a plurality of first electrodes and a plurality of second electrodes arranged between said first and second substrate portions;
   at least one organic active layer arranged between said plurality of first electrodes and said plurality of second electrodes;
   wherein a continuous line or stripe of at least a first adhesive material encircles each of said solar cell units and the thickness of said continuous line or stripe of at least a first adhesive material is at most 10 μm in a direction orthogonal to said first and second substrates and wherein a plurality of discontinuous portions of a second non-conductive adhesive material is spatially arranged within each said solar cell module.

2. The solar cell sheet according to claim 1, wherein said first adhesive material is conductive or non-conductive, and/or wherein said first adhesive material at least partly forms an outer and an inner line.

3. The solar cell sheet according to claim 1 wherein said first and/or said second adhesive materials are hydrophobic adhesive materials.

4. The solar cell sheet according to claim 1, wherein said thickness of said line or stripe of said first adhesive material is at least 10 nm.

5. The solar cell sheet according to claim 1, wherein said continous line or stripe of said first adhesive material has a width at least 10 μm and/or at most 0.1 mm in a direction parallel with said first and second substrates.

6. The solar cell sheet according to claim 1 wherein said second adhesive layer is discontinous and the ratio between the area covered and the area uncovered by said second adhesive material within a solar cell module is at least 1% or at least 10% or at least 20% and/or at most 40% or at most 30% or at most 25%.

7. The solar cell sheet according to claim 1, wherein said second adhesive material is optically transparent or semi-transparent within a wavelength range of said at least one organic active layer.

8. The solar cell sheet according to claim 2, wherein one of said outer and inner lines is more hydrophobic compared to the other.

9. The solar cell sheet according to claim 8, wherein the other of said outer and inner lines have a higher oxygen permeability compared to the other.

* * * * *

UNITED STATES PATENT AND TRADEMARK OFFICE
CERTIFICATE OF CORRECTION

PATENT NO. : 11,696,457 B2
APPLICATION NO. : 17/275114
DATED : July 4, 2023
INVENTOR(S) : Jonas Bergqvist and Thomas Österberg It is certified that error appears in the above-identified patent and that said Letters Patent is hereby corrected as shown below:

In the Claims

In Column 14, Line 30, Claim 5, delete "continous" and insert -- continuous --;

In Column 14, Line 34, Claim 6, delete "discontinous" and insert -- discontinuous --.

Signed and Sealed this
Tenth Day of September, 2024

Katherine Kelly Vidal
*Director of the United States Patent and Trademark Office*